United States Patent
Tuttle et al.

(10) Patent No.: US 6,646,867 B1
(45) Date of Patent: Nov. 11, 2003

(54) APPARATUS FOR FLAME CONTAINMENT IN ELECTRONIC DEVICES

(75) Inventors: Erick J. Tuttle, Fort Collins, CO (US); Samuel Martin Babb, Fort Collins, CO (US); Kristina Lynn Mann, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 36 days.

(21) Appl. No.: 10/141,488

(22) Filed: May 7, 2002

(51) Int. Cl.[7] .............................................. H05K 7/20
(52) U.S. Cl. ..................... 361/683; 361/687; 361/692; 361/695; 454/184; 174/16.1; 55/444
(58) Field of Search .................... 361/683, 686–689, 361/694, 692, 695, 723–726, 825; 165/80.2, 80.3, 185, 104.32, 104.33, 104.34, 121; 454/184, 357, 364, 369, 187, 342, 330–332; 236/49.5, 49.3; 174/15.1, 16.1, 16.3, 17 VA, 522, 17 R, 121 A, 53; 220/3.2, 3.3, 88 R, 88 A; 55/444, 446, 491; 312/223.1, 223.2, 223.3

(56) References Cited

U.S. PATENT DOCUMENTS

| | | | | |
|---|---|---|---|---|
| 4,484,690 A | * | 11/1984 | Nash | 220/88.2 |
| 6,130,381 A | * | 10/2000 | Keith et al. | 174/17 VA |
| 6,289,795 B1 | | 9/2001 | McLemore et al. | |
| 6,301,108 B1 | * | 10/2001 | Stockbridge | 361/688 |
| 6,314,868 B1 | | 11/2001 | Christensen et al. | |
| 6,462,670 B1 | * | 10/2002 | Bolognia et al. | 340/815.45 |
| 6,538,881 B1 | * | 3/2003 | Jeakins et al. | 361/687 |
| 6,558,004 B2 | * | 5/2003 | Ito et al. | 353/57 |

FOREIGN PATENT DOCUMENTS

JP        02000323883 A  *  11/2000  ............ H05K/7/20

OTHER PUBLICATIONS

Article "Smoke Damage–Protection for Personal Computers and Workstations", IBM Tecnical Disclosure Bulletine, vol. No. 36, Issue No. 3, p. No. 519–522, Mar. 1, 1993.*
Searby et al, US Patent Application Publication US 2003/0011287A1.*
Dean, US Patent Application Publication US 2003/0006680 A1.*

* cited by examiner

Primary Examiner—Darren Schuberg
Assistant Examiner—Michael Datskovsky

(57) ABSTRACT

An apparatus for flame containment in electronic devices is provided. One embodiment comprises an apparatus for preventing flames from exiting an electronic device via at least one air vent structure of the electronic device. The apparatus comprises a frame and a plurality of louvers coupled to the frame, the plurality of louvers being oriented so as to prevent flames from exiting the electronic device via the at least one air vent structure when the apparatus is situated adjacent to the at least one air vent structure.

30 Claims, 4 Drawing Sheets

APPARATUS FOR FLAME CONTAINMENT IN ELECTRONIC DEVICES

FIELD OF THE INVENTION

The present invention relates to flame containment, and in one aspect to an apparatus for flame containment in electronic devices.

BACKGROUND OF THE INVENTION

Electronic devices often include at least one air vent structure from which air may exit such devices. A non-limiting example of an electronic device that includes an air vent structure is a computer device. In some instances, such air vent structures are part of a housing (e.g., chassis) of an electronic device. In addition or in the alternative, such air vent structures are part of another component of the electronic device, such as a power supply.

Furthermore, electronic devices normally must meet certain standards and/or regulatory requirements. Some of these standards, etc., relate to the ability of the electronic device to prevent flames from spreading from and/or between electronic devices. One reason flame containment is an important characteristic for an electronic device is because of the significant damage that may occur if flames are able to spread from and/or between electronic devices. One feature of an electronic device from which such flames may potentially spread is the earlier-discussed air vent structure.

Satisfying the earlier-discussed standards, requirements, etc., often involves passing a series of tests. One such test is what is sometimes referred to in the art as an excessive flame test. During the excessive flame test, gasses emitting from a nozzle or other like means are ignited. The nozzle is then placed inside the electronic device or proximate thereto. The nozzle may be placed anywhere the test administrator feels there might be an ignitable fireload (e.g., a power supply). As a result of the above, flames are produced within the electronic device to simulate self-ignition or fire spreading from another location. Whether such flames are able to escape the volume of the electronic device determines whether the electronic device passes the excessive flame test. If no flames escape from the volume of the electronic device, the device passes. If, however, one or more flames manage to escape, the device fails. An electronic device may fail the excessive flame test because a flame(s) escapes the volume of the device via an air vent structure of the device.

In an effort to prevent excessive flame test failures (as well as to prevent the type of damage discussed earlier that may result from the spread of flames), some existing computer devices have been equipped with an add-on module that attaches to the housing of a computer device. This add-on module is depicted in FIGS. 1A and 1B. In FIG. 1A, add-on module 120 is attached to housing 110 of computer device 100. Housing 110 includes a rear portion 130 that includes air vent structures 170 and 180. In addition to housing 110, computer device 100 includes power supply 140, a panel of which (i.e., panel 160) is left exposed by housing 110. Panel 160 includes air vent structure 150.

Normally, when attached to the housing, the add-on module overhangs a portion of the housing. For example, as can be seen in FIGS. 1A and 1B, add-on module 120 overhangs rear portion 130 of housing 110. As a result of such overhang, the volume of computer device 100, for at least the purposes of the excessive flame test, is increased. To illustrate using FIG. 1B, once the add-on module is attached to the housing, the volume of the computer device is calculated by determining the projected parameters of the computer device if the sides of housing 110, as well as rear portion 130, were extended to meet the distal end of the overhanging portion of add-on module 120 (illustrated by dashed lines in FIG. 1B). Although flames may still exit computer device 100 through any of vent structures 150, 170, and 180 during the excessive flame test, such flames typically do not reach beyond the additional volume ΔV provided by the module. Thus, computer devices having such an add-on module often pass the excessive flame test.

However, the use of an add-on module increases the overall size of the computer device. As a result, a computer device with an add-on module attached thereto occupies more valuable space than a computer device without an add-on module. Thus, an add-on module may not be an efficient solution for a problem localized in a small area. Furthermore, often, such add-on modules are aesthetically unpleasing to the user. In addition, an add-on module is added material that may increase the weight and cost of a computer device. Furthermore, Moreover, an add-on module may not be an appropriate solution to flame containment for other electronic devices.

SUMMARY OF THE INVENTION

The present invention is directed to an apparatus for flame containment in electronic devices. One embodiment comprises an apparatus for preventing flames from exiting an electronic device via at least one air vent structure of the electronic device. The apparatus comprises a frame and a plurality of louvers coupled to the frame, the plurality of louvers being oriented so as to prevent flames from exiting the electronic device via the at least one air vent structure when the apparatus is situated adjacent to the at least one air vent structure.

DETAILED DESCRIPTION OF THE INVENTION

Figure 2:
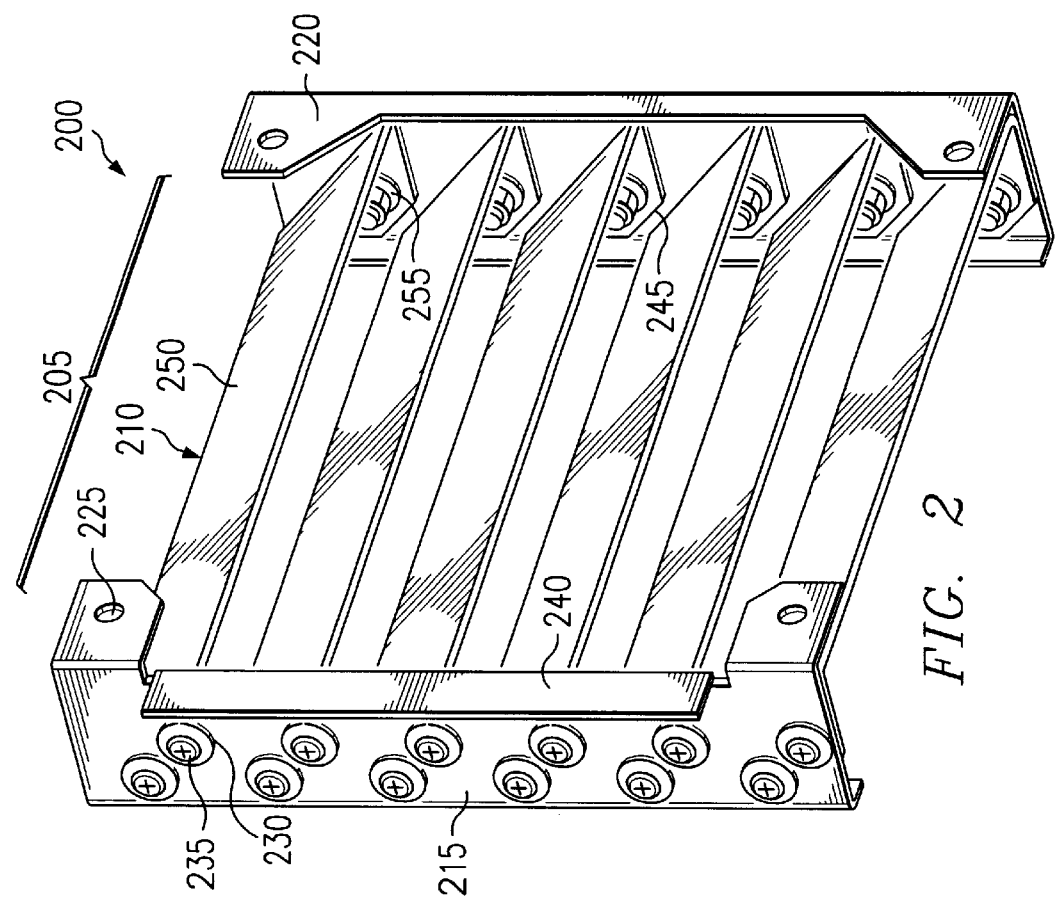
FIG. 2 depicts an exemplary flame containment apparatus according to an embodiment of the present invention.

FIG. 2 illustrates an exemplary embodiment of a flame containment apparatus that may be used with electronic devices. In one embodiment, a flame containment apparatus prevents (preferably all) flames from exiting an electronic device via at least one air vent structure of an electronic device when the flame containment apparatus is situated adjacent to the at least one air vent structure. It will be appreciated that an air vent structure is typically understood by those of ordinary skill in the art to comprise an air vent formed by a panel of an electronic device and a grille coupled to the panel. Such a grille may be part of the panel itself. Moreover, the grille itself may be a louver.

An electronic device, for purposes of this disclosure only, is any electrically powered device, now known or later developed. The components of such an electronic device may include a power supply. A non-limiting example of an electronic device is a computer device. A computer device, for purposes of this disclosure only, is a device that comprises at least one processor. However, a computer device may further comprise other elements as well, such as memory (e.g., disk drives), input/output lines, keyboards, display devices, network communication adapters, the earlier-mentioned power supply, etc. Non-limiting examples of a computer device include server devices, client devices, storage devices, bridges, routers, hubs, and/or the like. Other non-limiting examples of an electronic device include a television, an audio device, a video cassette recorder, a digital video disk (DVD) player, a refrigeration device, a cooking device, a dishwasher, an air conditioning unit, an electric heating device, an electronic musical device, an electronic clock, an electric tool, a combination thereof, and/or the like. It will be appreciated that in some instances, one or more the above-listed electronic devices may themselves qualify as a computer device.

In the illustrated embodiment, flame containment apparatus 200 comprises frame 205 having at least one louver (e.g., louver 210) coupled thereto. The coupling(s) between frame 205 and the louvers may be fixed. However, in some embodiments, one or more of these couplings are adjustable (e.g., rotatable).

As discussed, in one embodiment, apparatus 200 is operable to be situated adjacent to one or more air vent structures of an electronic device. In one embodiment, as part of such, apparatus 200 is operable to be situated within the electronic device; the dimensions of apparatus 200 being accordingly sized. Moreover, in some embodiments, apparatus 200 is operable to be situated within a power supply of an electronic device. In one of these embodiments, the dimensions of apparatus 200 are comparable in size to that of an air moving device (e.g., fan) that may be included in the power supply. In addition, the dimensions of apparatus 200 may be such that the area of a surface of apparatus 200 facing an air vent structure of an electronic device is equal to or larger than that of those surface(s) of the air vent structure(s) facing apparatus 200.

In the illustrated embodiment, frame 205 comprises first frame piece 215 and second frame piece 220. Piece 215 and/or piece 220 may form at least one aperture (e.g., aperture 225) to aid in the coupling of apparatus 200 to an object (e.g., a panel of an electronic device housing, a panel of a power supply housing, etc.). In one embodiment, these apertures are adapted to receive one or more suitable coupling means, such as screws, bolts, rivets snaps, and/or the like. In alternative embodiments, frame 205 may be welded to or formed as part of another object (e.g., a panel of a housing device, chassis, etc.).

Similarly, piece 215 and/or piece 220 may form at least one aperture (e.g., aperture 230) to aid in the coupling of louvers 210 to frame 205. Like the earlier-discussed apertures, these apertures may be adapted to receive one or more suitable coupling means (e.g., coupling means 235), such as screws, bolts, rivets, snaps, and/or the like. In alternative embodiments, one or more louvers are welded to frame 205 or formed as part of frame 205. The coupling between louvers 210 and frame 205 may be such that the orientation of louvers 210 may be adjusted (e.g., the couplings may be rotatable).

The pieces of frame 205 may be formed from flame-resistant materials (e.g., metal). In one embodiment, frame 205 is formed from a combination of metal and other flame-resistant materials. Some portion of the material(s) of frame 205 may not be resistant to flame.

In one embodiment, one or more louvers (e.g., louver 210) are coupled to frame 205. Louver 210 comprises a rectangular first portion 250, as well as one or more coupling panels extending therefrom (e.g., panel 245). These coupling panels may form one or more apertures (e.g., aperture 255) to aid in the coupling of the louver to frame 205. Similar to the earlier discussed apertures of frame 205, these louver apertures may be adapted to receive one or more suitable coupling means (e.g., coupling means 235), such as screws, bolts, moveable brackets, etc. However, as mentioned, in alternative embodiments, one or more louvers are welded to or formed as part of frame 205. Furthermore, again, the couplings between louvers 210 and frame 205 may be such that the orientation of louvers 210 may be adjusted (e.g., the couplings may be rotatable).

Similar to frame 205, the louvers may be formed from flame-resistant materials (e.g., metal). Also similar to frame 205, the louvers may be formed from some combination of metal and other flame-resistant materials. In addition, some portion of the material(s) of the louvers may not be resistant to flame. The louvers may be made from the same or different materials than those used to make frame 205.

In the illustrated embodiment, the louvers of apparatus 200 are oriented at a negative angle with respect to one or more horizontal planes of apparatus 200. It is not necessary that all of the louvers be oriented at the same angle. Moreover, it is not necessary that the louvers be oriented at the above-described negative angle. In one embodiment, the angle(s) of orientation of the louvers prevents (preferably all) flames from exiting an electronic device when apparatus 200 is situated adjacent to one or more air vents formed by the electronic device.

In one embodiment, frame 205 further comprises at least one keying fixture, the keying fixture ensuring that the louvers of apparatus 200 are oriented at an angle(s) enabling prevention of the exit of flames from an electronic device when apparatus 200 is situated adjacent to at least one air vent structure of the electronic device. The keying fixture may be in the form of a tab (e.g., tab 240) or other appendage. In addition or in the alternative, the keying fixture may comprise an arrangement of the coupling apertures of frame 205 (e.g., the arrangement shown in FIG. 2) in a specific pattern whereby apparatus 200 may only be matched with corresponding features of the electronic device (e.g., other coupling apertures) if the louvers of apparatus 200 are positioned in the proper orientation to prevent flames from exiting the electronic device through one or more air vent structures.

It will be appreciated by one of ordinary skill in the art that the components of apparatus 200 depicted in FIG. 2, as well as their shapes, dimensions, and arrangement, are by way of example only. Apparatus 200 may comprise different components than those depicted in FIG. 2, as well as a smaller or greater number of components. For example, rather than having two pieces, frame 205 may be a continuous frame of a particular geometric shape (e.g., a rectangle). Likewise, rectangular portion 250 of the louvers discussed above may instead be a non-rectangular shape (e.g., curved or non-planar). In addition, there need not be uniformity in the means for coupling the louvers to frame 205. For example, in one embodiment, some louvers are bolted to frame 205, while others are welded. Moreover, there need not be uniformity in the materials used to form each louver or frame piece.

Figure 1A:
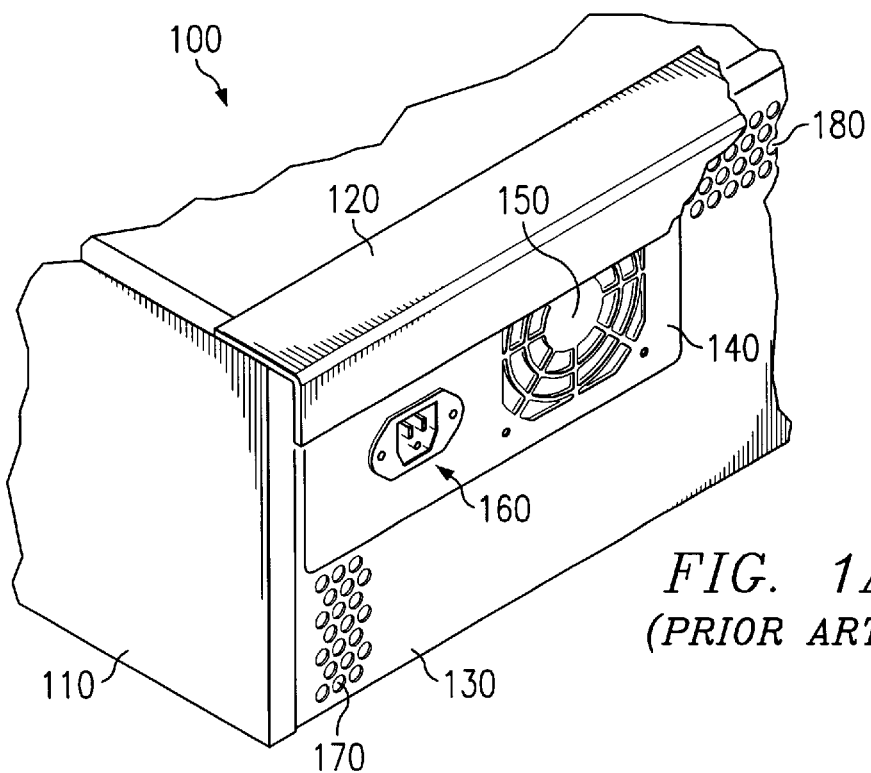
FIG. 1A depicts an existing add-on module for increasing the volume of a computer device.
Figure 1B:
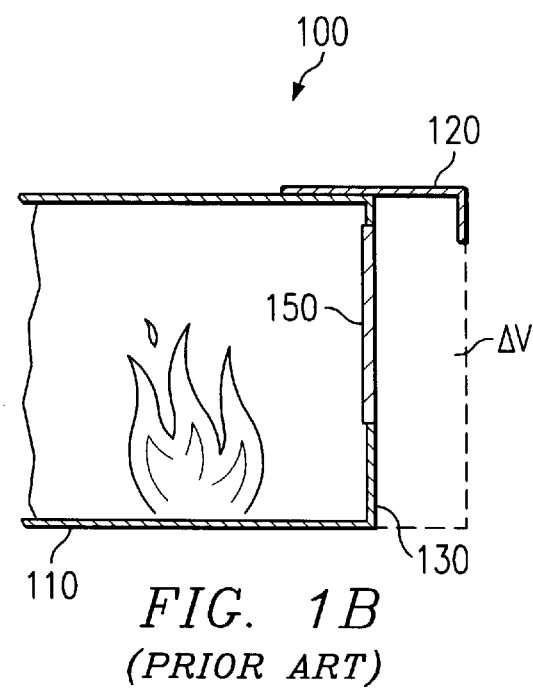
FIG. 1B illustrates the increase in volume of a computer device as a result of the add-on module of FIG. 1A.
Figure 3A:
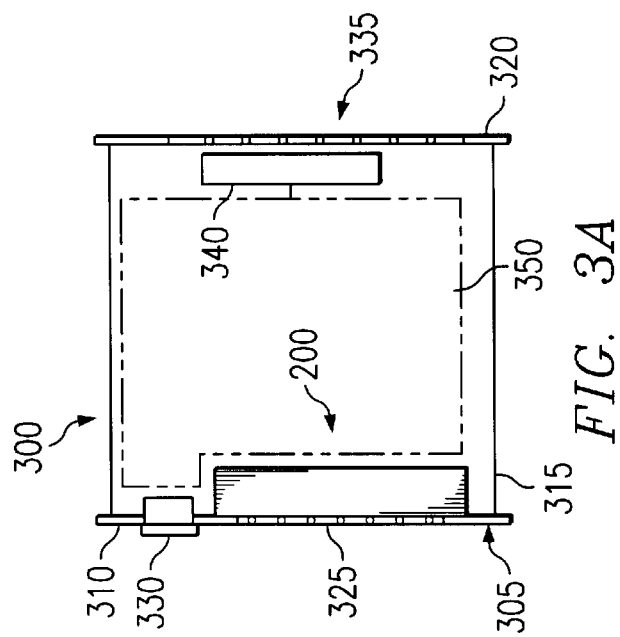
FIG. 3A depicts a top view of an exemplary power supply in accordance with an embodiment of the present invention.
Figure 3B:
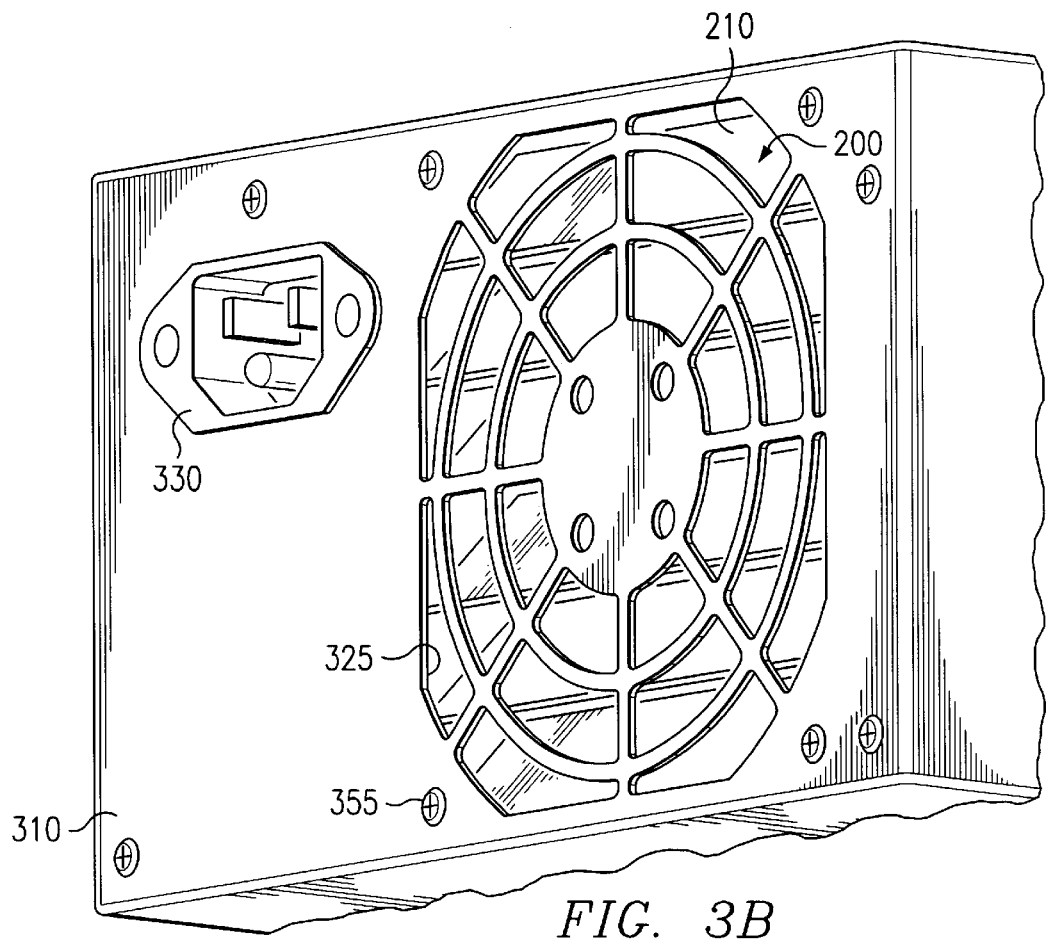
FIG. 3B depicts an exemplary rear panel of the power supply depicted in FIG. 3A.

As mentioned earlier, apparatus 200 may be situated within an electronic device. Also as mentioned, in some embodiments, apparatus 200 may be situated within a power supply of an electronic device. FIGS. 3A and 3B depict an exemplary embodiment of a power supply including apparatus 200 situated therein. FIG. 3A provides a top view of power supply 300 with its cover removed, exposing some of the contents therein. Power supply 300 may be a power supply of a computer device. In the illustrated embodiment, power supply 300 comprises a housing 305 having a rear panel 310 and a front panel 320 coupled to a bottom panel (not shown). It will be appreciated that housing 300 may include other panels. The panels of housing 305 may be made from metal.

In addition to housing 305, power supply 300 comprises air vent structure 325. In one embodiment, air vent structure 325 allows air to enter and/or exit power supply 300. Air vent structure 325 may be of any size, shape, or arrangement. A front view of an exemplary embodiment of air vent structure 325 is depicted in FIG. 3B.

Power supply may further comprise air vent structure 335. Similar to air vent structure 325, air vent structure 335 may allow air to enter and/or exit power supply 300. Also similar to air vent structure 325, air vent structure 335 may be of any size, shape, or arrangement. In some embodiments, air vent structure 335 has a different size, shape, and/or arrangement than that of air vent structure 325.

Protruding from rear panel 310 in the embodiment of FIG. 3A is power connector 330. Power connector 330 enables power supply 300 to be electrically coupled to an exterior power source, such as a wall outlet, a power protection device (e.g., surge protector), an uninterruptible power supply (UPS), and/or the like.

In one embodiment, power supply 300 further comprises circuit board 315 having circuit elements 350 integrated therewith. Among other things, circuit elements 350 manage the power supply functions of power supply 300, as well as provide signals to and/or receive signals from other components of the electronic device in which power supply 300 is incorporated (e.g., a motherboard, a backplane, a remote power switch). In one embodiment, power supply 300 comprises one or more connectors (not shown) that enable such provision of power or exchange of signals with other components of the electronic device. Furthermore, circuit elements 350 may also exchange signals with other components of power supply 300 (e.g., air moving device 340 described below).

Communicatively coupled to circuit elements 355 within housing 305 is air moving device 340. In one embodiment, air moving device 340 controls the circulation of air through the power supply (e.g., by influencing air intake and exhaust). In some embodiments, air moving device 340 is responsible for controlling the circulation of air within the entire electronic device in which power supply 300 is incorporated. Air moving device 340 may draw air into power supply 300 via air vent structure 335 and exhaust air out of power supply 300 via air vent structure 325. Furthermore, air moving device 340 may be any air moving device (e.g., a fan), now known or later developed, that is adapted for use within a power supply. Power supply 300 may further comprise other cooling components besides an air moving device. For example, power supply 300 may comprise one or more heat sinks (not shown) for absorbing and dissipating heat generated by circuit components within power supply 300.

In one embodiment, air moving device 340 is situated adjacent to air vent structure 335. Air moving device 340 need not be flush with air vent structure 335. In some embodiments, air moving device 340 is located at a position further away from front panel 320 than that which is depicted in FIG. 3A. The width of air vent structure 335 may be greater or smaller than the width of air moving device 340.

In some embodiments, power supply 300 does not include an air moving device. In one of these embodiments, the electronic device in which power supply 300 is installed includes at least one air moving device positioned outside of power supply 300. For example, the air moving device may be attached to the exterior of power supply 300 or situated at a location completely independent from the power supply. These air moving devices positioned outside of power supply 300 may be any air moving device now known or later developed that is suitable for use with an electronic device. In one embodiment, an electronic device may have air moving devices both within and outside of a power supply.

Returning to FIG. 3A, in the illustrated embodiment, flame containment apparatus 200 is situated adjacent to air vent structure 325. In one embodiment, it is not necessary that apparatus 200 be flush with such an air vent structure. In some embodiments, apparatus 200 may be coupled to rear panel 310. Moreover, in one of these embodiments, apparatus 200 is coupled to a surface of panel 310 facing the interior of the electronic device in which power supply 300 is situated. In an alternative embodiment, apparatus 200 is coupled to a surface of panel 310 facing the exterior of the electronic device in which power supply 300 is situated. In some embodiments, apparatus 200 occupies the location within a power supply sometimes occupied by an air moving device.

Apparatus 200 may be situated within power supply 300 such that the one or more louvers of apparatus 200 (e.g., louver 210) are oriented in a manner that enables the louvers to prevent (preferably all) flames from exiting power supply 300 via at least one air vent structure (e.g., air vent structure 325). Similar to earlier discussions, in some embodiments, apparatus 200 comprises one or more tabs or other appendages (e.g., tab 240) that act as keying fixtures to ensure apparatus 200 is situated in such a manner within power supply 300. Also similar to earlier discussions, apparatus 200 may have a keying fixture comprising an arrangement of the coupling apertures of frame 205 in a specific pattern whereby apparatus 200 may only be matched with corresponding features in the power supply (e.g., other coupling apertures) if apparatus 200 is positioned in the proper orientation for flame containment.

Furthermore, in one embodiment, the area of the surface of apparatus 200 facing air vent structure 325 is greater than or equal to that of the area of the surface of air vent structure 325 facing apparatus 200. The result of which is that flames within power supply 300 are unable to circumvent apparatuses and exit power supply 300 via air vent structure 325.

A non-limiting example of the above-described disposition of apparatus 200 within power supply 300 is provided in FIG. 3B. FIG. 3B provides a view of an embodiment of rear panel 310 from outside of housing 305. In the illustrated embodiment, apparatus 200 has been coupled to rear panel 310 using one or more coupling means (e.g., coupling means 355). These one or more coupling means may comprise screws, bolts, rivets, snaps, and/or the like. Similar to earlier discussions, in some embodiments, apparatus 200 may be welded to or formed as part of rear panel 310.

In FIG. 3B, a plurality of louvers of apparatus 200 (e.g., louver 210) may be seen through air vent structure 325. In the illustrated embodiment, the louvers are positioned at the earlier discussed negative angle. Also, the area of the surface of apparatus 200 facing air vent structure 325 is greater than or at least equal to that of the surface of air vent structure 325 facing apparatus 200.

It will be appreciated by one of ordinary skill in the art that the embodiment of power supply 300 depicted in FIGS. 3A and 3B is by way of example only. Power supply 300 may have fewer or more elements than those depicted in FIG. 3A and 3B, as well as different elements. The dimensions, arrangement, and orientation of the elements of power supply 300 may be different as well. For example, power supply 300 may comprise a plurality of air moving devices. Furthermore, power supply 300 may comprise other air vent structures in addition to or in the alternative of air vent structures 325 and 335. Moreover, power supply may contain more than one flame containment apparatus. In such embodiments, these flame containment apparatuses may each be situated adjacent a different air vent structure of power supply 300. In addition, in one embodiment, power supply 300 is a redundant power supply. In such embodiments, power supply 300 comprises two or more power supply units, each of which is capable of powering the computer device by itself. Furthermore, apparatus 200 may be situated closer to front panel 320, and air moving device 340 may be situated closer to rear panel 310, than that which is depicted in FIG. 3A. The exact contents of any one power supply are often influenced by both the power supply's form factor and its individual design, and therefore may vary accordingly.

Figure 4:
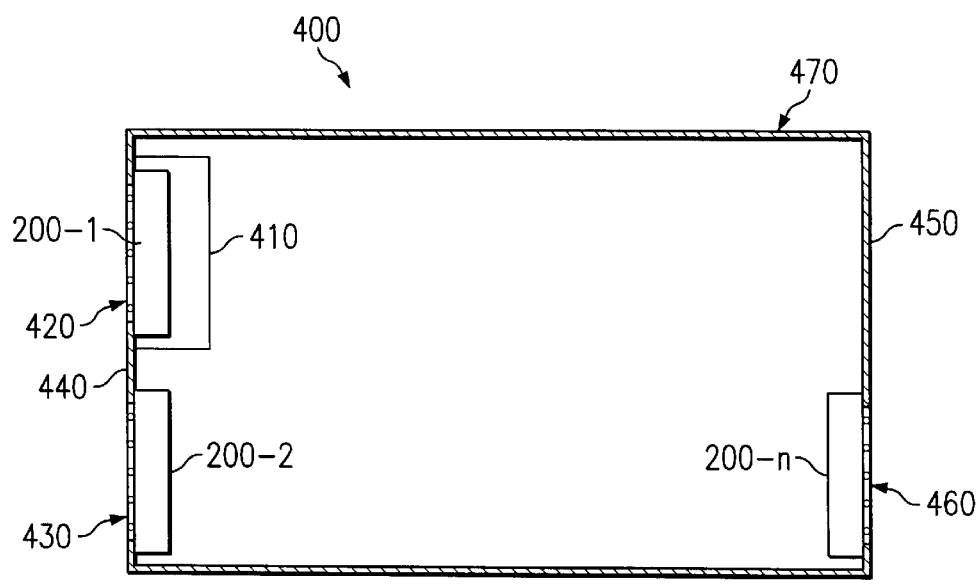
FIG. 4 depicts an exemplary embodiment of an electronic device in accordance with an embodiment of the present invention.

A flame containment apparatus may be situated adjacent to one or more air vent structures of an electronic device other than those of a power supply. An exemplary embodiment of such is illustrated in FIG. 4. FIG. 4 provides a top view of an electronic device 400 comprising a housing 470. In the illustrated embodiment, housing 470 comprises a first panel 440 and a second panel 450. However, it will be appreciated by one of ordinary skill in the art that housing 470 may further comprise other panels (not shown). For example, housing 470 may comprise a rectangular box.

Furthermore, electronic device 400 may comprise a plurality of air vent structures. For example, electronic device 400 may comprise air vent structures 420, 430 and 460. In the illustrated embodiment, air vent structure 420 is part of power supply 410. The air vent structures of electronic device 400 may be of any size, shape, or arrangement. Moreover, in one embodiment, at least two of the above-mentioned air vent structures are of different sizes, shapes, and/or arrangements.

In one embodiment, a plurality of flame containment apparatuses 200 is situated within electronic device 400. For example, flame containment apparatus 200-2 is situated adjacent to air vent structure 430. Similarly, flame containment apparatus 200-n is situated adjacent to air vent structure 460. Likewise, flame containment apparatus 200-1 is situated adjacent to air vent structure 420. In one embodiment, at least one of the flame containment apparatuses are situated adjacent to the opposite side of housing 410 than that depicted in FIG. 4. Furthermore, at least one of flame containment apparatuses 200-1 and 200-n may be coupled to housing 470. Likewise, apparatus 200-1 may be coupled to the housing of power supply 410.

Furthermore, in one embodiment, the areas of the respective surfaces of apparatuses 200-1, 200-2, and 200-n facing the respective air vent structures of electronic device 400 is greater than or equal to that of the areas of the respective surfaces of the respective air vents facing such apparatuses. Similar to the above, the result of such is that flames within electronic device 400 are unable to circumvent apparatuses and exit electronic device 400 via the air vent structures.

It will be appreciated by one of ordinary skill in the art that the embodiment of electronic device depicted in FIG. 4 is by way of example only. Electronic device 400 may comprise fewer or more elements than those depicted in FIG. 4, as well as different elements. The dimensions, arrangement, and orientation of the elements of electronic device 400 may be different as well. For example, electronic device 400 may not include a power supply.

Figure 5A:
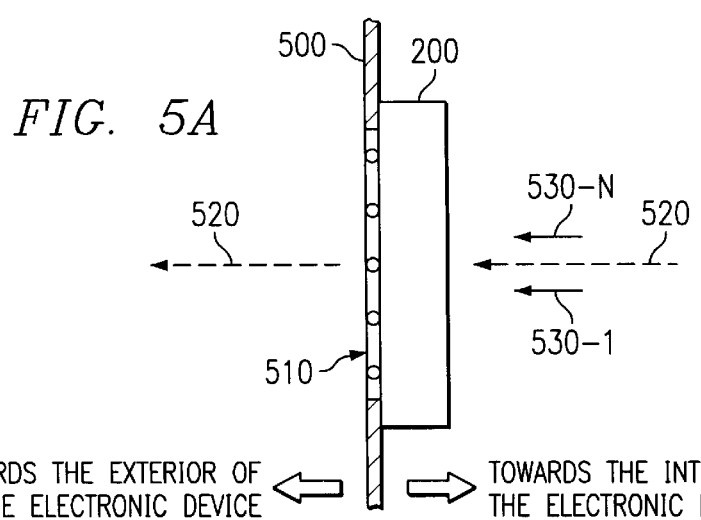
FIG. 5A depicts the relationship between airflow and flame movement within an electronic device in accordance with an embodiment of the present invention.
Figure 5B:
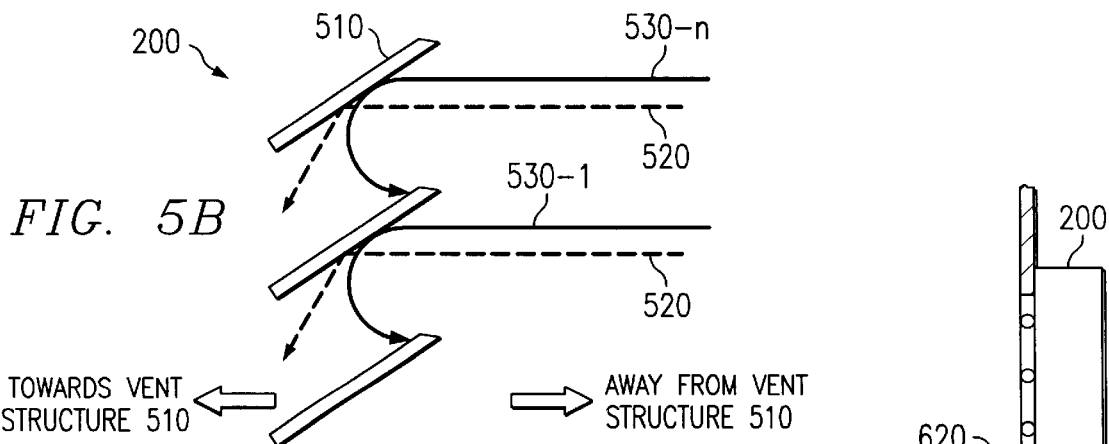
FIG. 5B depicts the louvers of an exemplary flame containment apparatus altering the direction of airflow, as well altering flames, in accordance with an embodiment of the present invention.

FIGS. 5A and 5B depict the effect apparatus 200 may have on airflow and flames attempting to exit an electronic device. FIG. 5A provides a top view of apparatus 200 and a panel 510, while FIG. 5B provides a cross-section of apparatus 200 depicted in FIG. 5A. In FIG. 5A, flame containment apparatus 200 is situated adjacent to air vent structure 510. Air vent structure 510 may be any size, shape, and arrangement. Apparatus 200 may be situated adjacent to the opposite surface of panel 500 than that depicted in FIG. 5A (i.e., the surface facing towards the exterior of the electronic device.)

In the illustrated embodiment, airflow 520 (represented by uniformly dashed lines in FIGS. 5A and 5B) is travelling within the electronic device towards air vent structure 510. Such airflow may be the result of an air moving device. It will be appreciated by one of ordinary skill in the art that the traces used to depict airflow 520 in FIGS. 5A and 5B are for example only and it is expected that airflow would not be as unidirectional as shown, e.g., more random and turbulent.

In some embodiments, the direction of airflow 520 is altered as it passes through apparatus 200. In one embodiment, this alteration in the direction of airflow 520 is the result of the louvers of apparatus 200. For example, in some embodiments (e.g., those where the louvers of apparatus 200 are oriented in the manner depicted in FIGS. 2 and 3B), airflow 520 impacts the louvers of apparatus 200 as it passes therethrough, as a result of which airflow 520 is deflected downwards (illustrated in FIG. 5B). Additionally or in the alternative, the louvers of apparatus 200 alter the velocity of airflow 520 as it passes through apparatus 200. For example, in some embodiments, as airflow 520 passes between two louvers of apparatus 200, the velocity profile of the airflow fluctuates from slow when the airflow is near a surface of the first louver to fast as the airflow moves between the first louver and the second louver and back to slow when the airflow is near a surface of the second louver. Although apparatus 200 changes characteristics of airflow 520, apparatus 200 still enables airflow 520 to exit the electronic device.

Furthermore, although by altering airflow 520, apparatus 200 may increase the amount of heat within the electronic device, such an increase in heat is minimal. Moreover, in some embodiments, such an increase in heat is compensated for by increasing the flow of an air moving device(s) of the electronic device.

Meanwhile, as discussed earlier, flames typically follow the airflow through an electronic device. Accordingly, in the illustrated embodiment, flames 530-1 and 530-n follow airflow 520 towards air vent structure 510. In one embodiment, the louvers of apparatus 200 (e.g., louver 210) are oriented such that the louvers prevent (preferably all) flames from passing on through apparatus 200 and eventually exiting the electronic device via vent structure 510. For example, in one embodiment, at some point after entering apparatus 200, flames 530-1 and 530-n impact one or more of the louvers of apparatus 200. However, unlike the situation with airflow 520, as a result of the impact, flames 530-1 and 530-n are altered such that flames 530-1 and 530-n do not pass through apparatus 200 and on to air vent structure 510. The flames may be dissipated, deflected, reflected, experience a change in length and/or otherwise altered such that the flames are prevented from exiting the electronic device via air vent structure 510.

Figure 6:
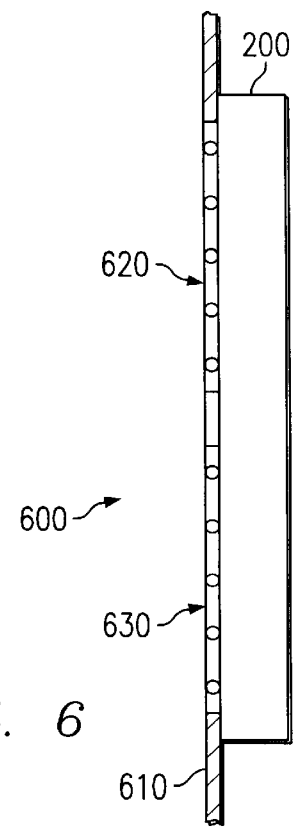
FIG. 6 depicts another exemplary electronic device in accordance with an embodiment of the present invention.

In some embodiments, a flame containment apparatus may be situated adjacent to more than one air vent structure. An example of such is provided in FIG. 6. FIG. 6 depicts an top view of an electronic device comprising air vent structures 620 and 630. Air vent structure 610 and air vent structure 620 may be of any size, shape, or arrangement.

Flame containment apparatus 200 is situated adjacent to both air vent structure 620 and air vent structure 630. In one embodiment, apparatus 200 is coupled to panel 610. In some embodiments, apparatus 200 prevents (preferably all) flames from exiting the electronic device via vent structure 620 or vent structure 630. Furthermore, in one of these embodiments, the surface of apparatus 200 facing structure 620 and structure 630 has an area sufficient to cover vent structures 620 and 630.

In various embodiments, the present invention alleviates some of the difficulties associated with the prior art. Moreover, by preventing flames from exiting an electronic device, embodiments of the flame containment apparatus may prevent the damage discussed earlier that may result from flames spreading from and/or between electronic devices.

Moreover, in one embodiment, the flame containment apparatus enables such flame containment without the need to expand the volume of the electronic device in any manner. For example, in some embodiments, the flame containment apparatus may be situated within the volume (i.e., case and cover dimensions) of existing electronic device designs. Moreover, in one of these embodiments, the flame containment apparatus may be situated within the volume of existing power supply designs. For example, the flame containment apparatus may fit into an area that is often occupied by the power supply's internal air moving device. Accordingly, the volume of such electronic devices, power supplies, etc. need not be increased so to accommodate the flame containment apparatus.

Furthermore, in some embodiments, production of a flame containment apparatus involves small material costs and can be made of simple parts by a simple assembly procedure. Furthermore, the flame containment apparatus may be aesthetically pleasing.

What is claimed is:

1. An apparatus for preventing flames from exiting an electronic device via at least one air vent structure of said electronic device, said apparatus comprising:

a frame; and a plurality of louvers coupled to said frame, said plurality of louvers being oriented so as to prevent said flames from exiting said electronic device via said at least one air vent structure when said apparatus is situated adjacent to said at least one air vent structure.

2. The apparatus of claim 1 wherein said electronic device comprises a device selected from the group consisting of a television, an audio device, a video cassette recorder, a digital video disk player, a refrigeration device, a cooking device, a dishwasher, an air conditioning unit, an electric heating device, an electronic musical device, an electronic clock, and an electric tool.

3. The apparatus of claim 1 wherein said electronic device comprises a computer device.

4. The apparatus of claim 3 wherein said computer device comprises a device selected from the group consisting of a personal computer, a portable computer, a data storage device, a server device, a client device, a bridge, a router, and a hub.

5. The apparatus of claim 1 wherein the orientation of said plurality of louvers is adjustable.

6. The apparatus of claim 1 wherein said plurality of louvers are operable to influence said flames in a manner selected from the group consisting of dissipating said flames, altering the direction of said flames, and altering the length of said flames.

7. The apparatus of claim 1 wherein said apparatus is operable to be situated within a power supply of said electronic device.

8. The apparatus of claim 1 wherein at least one of said plurality of louvers is oriented at a negative angle with respect to one or more horizontal planes of said apparatus.

9. The apparatus of claim 1 wherein said frame comprises at least one appendage operable to ensure the orientation when said apparatus is situated adjacent to said at least one air vent structure.

10. The apparatus of claim 1 wherein said frame forms at least one coupling aperture arrangement operable to ensure the orientation when said apparatus is situated adjacent to said at least one air vent structure.

11. An electronic device comprising an air vent structure; and a flame containment apparatus situated adjacent to said air vent structure, said flame containment apparatus comprising a plurality of louvers coupled to a frame, said plurality of louvers being oriented so as to prevent flames from exiting said electronic device via said air vent structure.

12. The electronic device of claim 11 wherein said electronic device comprises a device selected from the group consisting of a television, an audio device, a video cassette recorder, a digital video disk player, a refrigeration device, a cooking device, a dishwasher, an air conditioning unit, an electric heating device, an electronic musical device, an electronic clock, and an electric tool.

13. The electronic device of claim 11 wherein said electronic device comprises a computer device.

14. The electronic device of claim 13 wherein said computer device comprises a device selected from the group consisting of a personal computer, a portable computer, a data storage device, a server device, a client device, a bridge, a router, and a hub.

15. The electronic device of claim 11 wherein said flame containment apparatus is coupled to a panel of said electronic device.

16. The electronic device of claim 11 wherein said flame containment apparatus is coupled to a surface of a panel of said electronic device facing the interior of said electronic device.

17. The electronic device of claim 11 wherein said flame containment apparatus is situated adjacent to a panel of a housing of said electronic device.

18. The electronic device of claim 11 wherein said flame containment apparatus is situated adjacent to a panel of a power supply of said electronic device.

19. The electronic device of claim 11 wherein the orientation of said plurality of louvers is adjustable.

20. The electronic device of claim 11 wherein said plurality of louvers are operable to influence said flames in a manner selected from the group consisting of dissipating said flames, altering the direction of said flames, and altering the length of said flames.

21. The electronic device of claim 11 wherein said electronic device further comprises another air vent structure and wherein another flame containment apparatus is situated adjacent to said another air vent structure.

22. The electronic device of claim 11 wherein said electronic device further comprises another air vent structure and wherein said flame containment apparatus is adjacent to both said air vent structure and said another air vent structure.

23. A power supply for use in an electronic device, said power supply comprising:

an air vent structure; and a flame containment apparatus operable to prevent flames from exiting said power supply via said air vent structure, said flame containment apparatus being disposed within said housing adjacent to said air vent structure.

24. The power supply of claim 23 wherein said flame containment apparatus is coupled to a panel of a housing of said power supply.

25. The power supply of claim 23 wherein said flame containment apparatus comprises a plurality of louvers coupled to a frame, said plurality of louvers being oriented so as to prevent said flames from exiting said power supply.

26. The power supply of claim 25 wherein said plurality of louvers are operable to influence said flames in a manner selected from the group consisting of dissipating said flames, altering the direction of said flames, and altering the length of said flames.

27. The power supply of claim 23 wherein said power supply further includes an air moving device, said air moving device being situated within said housing adjacent to another air vent structure.

28. A system for flame containment for an electronic device, said system comprising:

at least one flame containment apparatus, wherein ones of said at least one flame containment apparatus are situated adjacent to at least one air vent structure of said electronic device;

wherein each of said at least one flame containment apparatus comprises a plurality of louvers coupled to a frame, said plurality of louvers being oriented so as to prevent flames from exiting said electronic device via ones of said at least one air vent structure adjacent to said flame containment apparatus.

29. The system of claim 28 wherein at least one of said at least one flame containment apparatus is situated adjacent to at least two of said at least one air vent structure.

30. The system of claim 28 wherein each of said at least one flame containment apparatus is situated adjacent to a different air vent structure of said at least one air vent structure.

* * * * *